US007830195B2

(12) United States Patent
Douskey et al.

(10) Patent No.: US 7,830,195 B2
(45) Date of Patent: Nov. 9, 2010

(54) SELF-TEST DESIGN METHODOLOGY AND TECHNIQUE FOR ROOT-GATED CLOCKING STRUCTURE

(75) Inventors: Steven M. Douskey, Rochester, MN (US); Ryan A. Fitch, Auburn Hills, MI (US); Brandon E. Schenck, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 56 days.

(21) Appl. No.: 12/401,730

(22) Filed: Mar. 11, 2009

(65) Prior Publication Data

US 2010/0231281 A1 Sep. 16, 2010

(51) Int. Cl.
*G06F 1/04* (2006.01)
(52) U.S. Cl. .................. 327/291; 327/295; 327/239; 327/242; 327/415
(58) Field of Classification Search ......... 327/165–167, 327/239, 241–242, 251, 253, 257–259, 291–293, 327/295, 297, 415, 565
See application file for complete search history.

(56) References Cited

U.S. PATENT DOCUMENTS 6,448,835 B1 * 9/2002 Douskey et al. ............. 327/295
2008/0169848 A1 * 7/2008 Douskey et al. ............. 327/115

* cited by examiner

*Primary Examiner*—An T Luu
(74) *Attorney, Agent, or Firm*—Bockhop & Associates LLC

(57) ABSTRACT

In a method of generating clock signals for a level-sensitive scan design latch, at least one test input signal is transmitted to a plurality of splitter leaves. Once the test input signal is stabilized at each of the splitter leaves, generating a shaped oscillator clock signal having a predetermined pattern of pulses from a central root is generated. At the plurality of splitter leaves, the test input signal is logically combined with the shaped oscillator clock signal, thereby generating a first latch clock signal and a second latch clock signal. The logically combining action includes applying a delay of less than one clock cycle to the shaped oscillator clock signal to generate a delayed oscillator clock signal; logically combining the delayed oscillator clock signal with a second signal so as to generate the first latch clock signal; and logically combining the shaped oscillator clock signal with a third signal so as to generate the second latch clock signal.

18 Claims, 12 Drawing Sheets

SELF-TEST DESIGN METHODOLOGY AND TECHNIQUE FOR ROOT-GATED CLOCKING STRUCTURE

BACKGROUND OF THE INVENTION

1. Field of the Invention

The present invention relates to self-test circuits used in digital systems and, more specifically, to a clocking system used with a self-test circuit.

2. Description of the Prior Art

Digital integrated circuits sometimes experience faults that interfere with circuit functionality. Most modern digital circuits of any complexity are subject to a battery of tests that are designed to detect and, sometimes, correct such faults. A wide variety of tests are used to detect faults, including functional testing in which a series of inputs is applied to a circuit and the outputs are compared to expected outputs. Functional testing is effective for simple circuits, but becomes unmanageably complex as the complexity of the circuit grows.

More complex circuits employ scan designs, in which latches distributed through out the circuit are connected to each other in series. Test data is scanned into the latches and then the circuit is operated for a short period. The data in the latches is then scanned out of the circuit and compared to expected data. A typical digital integrated circuit includes a plurality of latches that store logical states within the integrated circuit. A scan design employs latches that have both a functional mode and a scan mode. In the functional mode, data propagates through the latches and the logical elements associated with the latches during normal operation of the integrated circuit. In the scan mode, data is scanned serially from latch to latch so that the integrated circuit can be set to a predetermined state. The scan mode can be useful for initializing the integrated circuit and can be useful for testing the integrated circuit.

In a scanning self test, a set of data is scanned into a series of interconnected latches and the clock controlling the logic elements of the processor is asserted for a number of cycles. The data from the latches is then scanned out of the system and is compared to an expected result to determine if any of the logic elements includes a fault.

Many complex integrated circuits employ a level-sensitive scan design (LSSD). In an LSSD integrated circuit, a series of pairs of latches are distributed throughout the circuit. Each pair includes a first latch that is clocked by a first clock signal and a second latch, which receives the immediate data output of the first latch and that is clocked by a second clock signal that is different from the first clock signal.

In certain LSSD designs, special pulsing arrangements of the first clock signal and the second clock signal are employed to improve test coverage. These special pulses can simulate situations in which, for example, the timing of the second clock signal becomes skewed relative to the timing of the first clock signal.

Many integrated circuits employ a clock tree to distribute a central clock signal throughout the circuit. The clock tree includes a "root" clock that is repowered throughout a circuit by a plurality of splitters that power various "leaves" associated with individual LSSD latches. Some circuits employ local waveform generators at the leaves to create the special pulses used in testing. This approach has the disadvantage of being cumbersome and using a considerable amount of chip area.

Another design, referred to as at-speed structural test (ASST), employs a central test waveform generator/deskew circuit to generate the test pulses. In LSSD designs that require precise clock control, such as those with Logic Built-In Self-Test (LBIST), it is increasingly challenging to gate the clocks in a physical design and still pass static timing analysis requirements. Additionally, test coverage must be maintained to assure manufacturing quality. With clock root gating, it is possible to absorb most of the clock control logic into one central place, thereby gating the oscillator rather than attempting to gate a clock splitter at the leaf of the tree. This significantly improves static timing closure turn-around, as well as reduces the number of global routes needed for clock control logic and reduces the size of the multiple use leaf splitter. Through the use of an oscillator shaping logic, the oscillator at the root of the tree can be shaped and modified to produce many different styles of clocks for testing and function. With root gating, however, test coverage typically declines due to the lack of unique control at the splitter level. ASST accomplishes clock root gating by moving most of the oscillator control to a test waveform generator and a clock deskew unit (collectively referred to as "TWG-DESKEW"). However, the ASST structures are not available in certain earlier technologies. They also require a number of specially developed circuits.

Therefore, there is a need for a system that uses existing circuit design to get testing results comparable to the ASST approach.

SUMMARY OF THE INVENTION

The disadvantages of the prior art are overcome by the present invention which, in one aspect, is a method of generating clock signals for a level-sensitive scan design latch, in which at least one test input signal is transmitted to a plurality of splitter leaves. Once the at least one test input signal is stabilized at each of the splitter leaves, generating a shaped oscillator clock signal having a predetermined pattern of pulses from a central root is generated. At the plurality of splitter leaves, the at least one test input signal is logically combined with the shaped oscillator clock signal, thereby generating a first latch clock signal and a second latch clock signal. The logically combining action includes applying a delay of less than one clock cycle to the shaped oscillator clock signal to generate a delayed oscillator clock signal; logically combining the delayed oscillator clock signal with at least a second signal so as to generate the first latch clock signal; and logically combining the shaped oscillator clock signal with at least one third signal so as to generate the second latch clock signal.

In another aspect, the invention is a method of generating a shaped clock signal, in which a first predetermined pattern of bits is loaded into a first shift register. A second predetermined pattern of bits is loaded into a second shift register. A next bit from the first shift register is coupled onto the shaped clock signal when an oscillator clock signal has a high value and then the first shift register is shifted by one bit. A next bit from the second shift register is coupled onto the shaped clock signal when the oscillator clock signal has a low value and then the second shift register is shifted by one bit.

In yet another aspect, the invention is a circuit, responsive to an oscillator clock signal, for applying a first latch clock signal and a second latch clock signal to a latch employed in a level-sensitive scan design-type integrated circuit. The circuit includes an oscillator that is configured to assert a clock signal. An oscillator shaping logic circuit is configured to generate a predetermined sequence of test clock pulses and transmit the sequence of test clock pulses onto a shaped oscillator signal line. A plurality of clock splitter waveform generators is distributed through the integrated circuit. Each clock splitter waveform generator is responsive to the shaped oscillator signal line and is configured to generate the first latch clock signal and the second latch clock signal. Each clock splitter waveform generator is also configured to combine logically the shaped oscillator signal line with at least one test signal so as to generate the first latch clock signal to have a first predetermined waveform and so as to generate the second latch clock signal to have a second predetermined waveform.

These and other aspects of the invention will become apparent from the following description of the preferred embodiments taken in conjunction with the following drawings. As would be obvious to one skilled in the art, many variations and modifications of the invention may be effected without departing from the spirit and scope of the novel concepts of the disclosure.

DETAILED DESCRIPTION OF THE INVENTION

Figure 1:
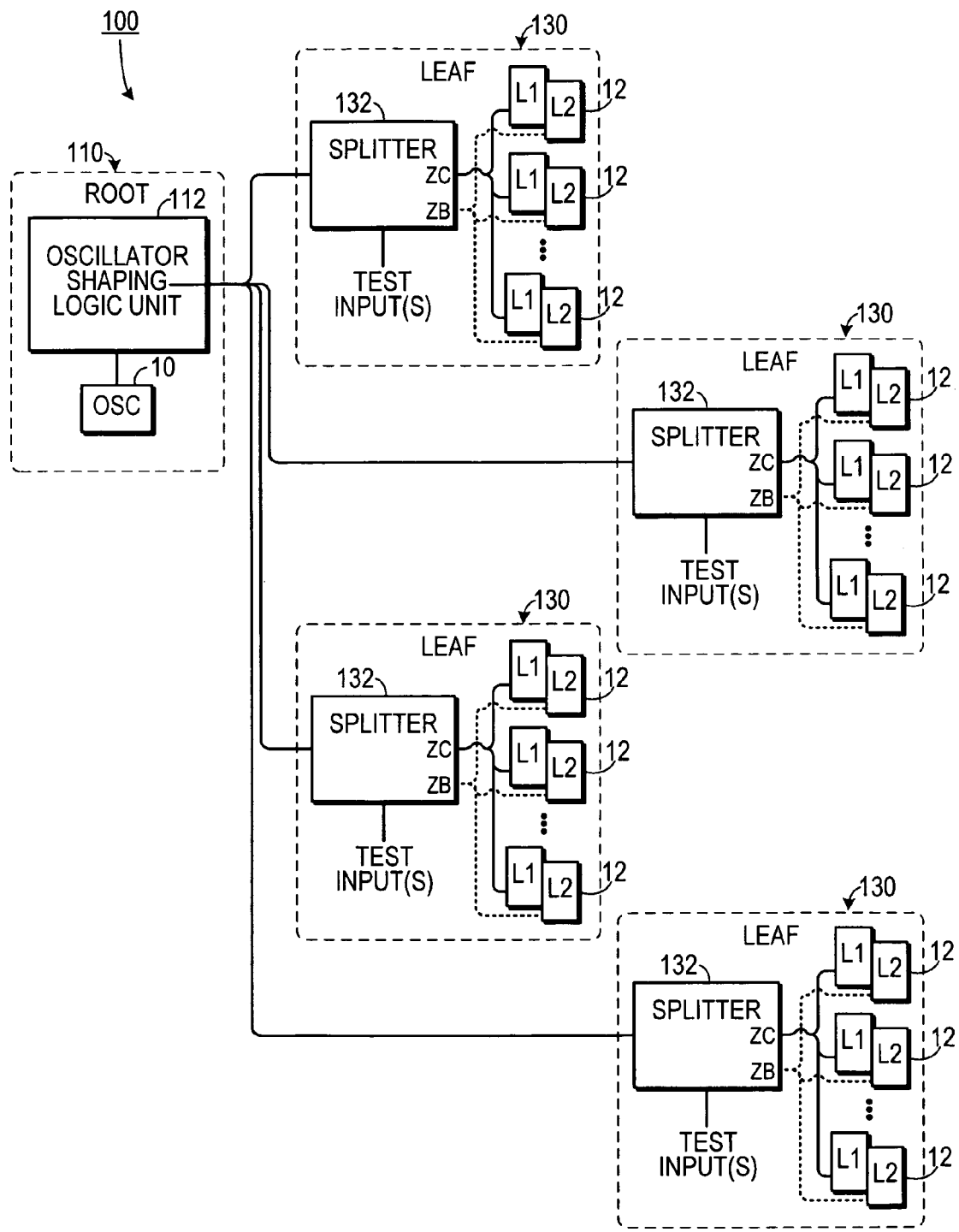
FIG. 1 is a schematic diagram of a system for generating clock signals for a level-sensitive scan design latches.

A preferred embodiment of the invention is now described in detail. Referring to the drawings, like numbers indicate like parts throughout the views. As used in the description herein and throughout the claims, the following terms take the meanings explicitly associated herein, unless the context clearly dictates otherwise: the meaning of "a," "an," and "the" includes plural reference, the meaning of "in" includes "in" and "on."

As shown in FIG. 1, one embodiment employs a root oscillation signal shaping logic circuit 110 that is employed on an integrated circuit, such as a processor. The root oscillation signal shaping logic circuit 110 includes an oscillator 10 that asserts a clock signal and an oscillator shaping logic unit 112 that generates and transmits a shaped oscillator clock signal to a plurality of clock splitter waveform generators 130, also referred to herein as "splitter leaves." Each splitter leaf 130 includes a clock splitter 132 that generates latch clock signals (such as a first "ZC" latch clock signal and a "ZB" latch clock signal) used to clock latches 12 (such as L1 and L2 level-sensitive scan design latches) in a testing environment. Each clock splitter 132 is responsive to one or more test signal inputs and the test signal inputs are logically combined with the shaped oscillator clock signal to generate the latch clock signals. By selecting appropriate values for the test signal inputs and by shaping the shaped oscillator clock signal appropriately, the latch clock signals will allow a desired type of test coverage at the latches 12.

Figure 2:
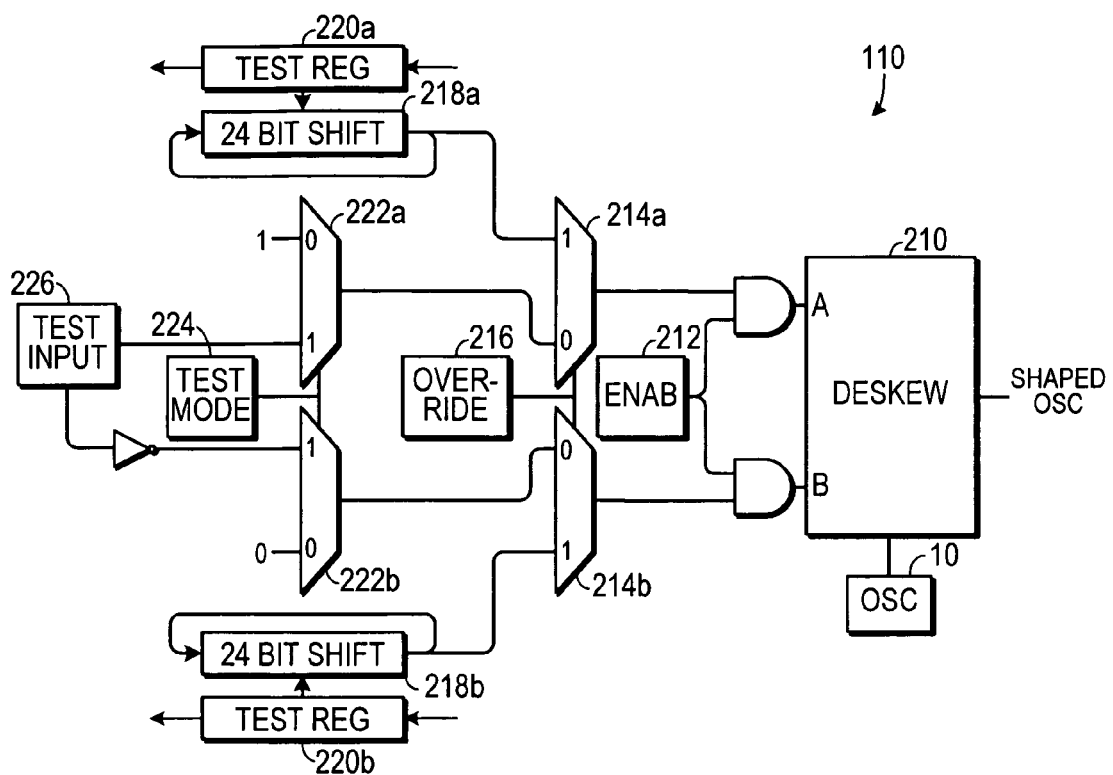
FIG. 2 is a schematic diagram of a shaped oscillator signal generating circuit.

One example of a root oscillation signal shaping logic circuit 110 is shown in FIG. 2. When generating an oscillation signal of a desired shape, a plurality of bits are written to a pair of test registers 220a and 220b. The bits in the test registers 220a and 220b are written to a corresponding pair of shift registers 218a and 218b. A deskew logic block 210 receives input from the oscillator 10. The deskew logic block 210, which has two inputs, designated as an "A" input and a "B" input, transmits the current of the "A" input to the shaped oscillator clock signal when the value received from the oscillator 10 is a logical "1" and transmits the current of the "B" input to the shaped oscillator clock signal when the value received from the oscillator 10 is a logical "0."

An enable logic input 212 will generate either a logic "0" or a logic "1." The value generated by the enable logic input 212 is AND'ed with an input signal so that either a "0" is transmitted to both the "A" input and the "B" input to the deskew logic block 210 when the value of generated by the enable logic input 212 is a "0," or a value of a predetermined clock input signal is when the value of generated by the enable logic input 212 is a "1."

It is the outputs of a first pair of selectors 214a and 214b that are AND'ed with the output of the enable logic input 212. The first pair of selectors 214a and 214b receive input either from a second pair of selectors 222a and 222b or from the pair of shift registers 218a and 218b. An override input 216 causes the first pair of selectors 214a and 214b to transmit the data from the pair of shift registers 218a and 218b when the value of the override input 216 is a "1" and transmit data from the second pair of selectors 222a and 222b when the value of the override input 216 is a "0."

The second pair of selectors 222a and 222b will transmit either the data from a test input 226 when the value of a test mode input 224 is a "1." Otherwise, selector 222a will transmit a "1" and selector 222b will transmit a "0."

In one embodiment of the Oscillator Shaping Logic (OSL) function, a DESKEW book is used to select the value of the current clock phase (along with the OSL), thereby allowing any combination of clocks equal or slower than the base oscillator to exist. When the oscillator is low, one path to the DESKEW is selected and the corresponding output clock assumes the value presented by the OSL. Similarly, when the oscillator is high, the other path to the DESKEW is selected.

The Oscillator Shaping Logic is where the waveform shaping occurs. It is important to support as many different clock shapes as possible for testability in lab or debug modes, or for functional changes found after fabrication. To accommodate this, a programmable clock function generator has been designed. In this design, two 24-bit shift registers can be programmed through JTAG eTDR write sequences before turning on the clocks. After an override (TWG_OVERRIDE) is enabled, the clocks will be purely based on the values shifting through these registers. Note also that the first 8 bits of these shift registers are gearing bits, intended to be cycled out of the register in the first 8 cycles of turning clocks on. This is to allow a lower-frequency pattern to gear up the clocks before the 24-bit rotating shift register takes over.

When the TWG_OVERRIDE is disabled (default) the clocks are gated using default tie values (the default oscillator has a 50% duty cycle). There is some logic in the path to allow for self-test (BIST) function, which is enabled when LBISTIP is activated. This logic produces oscillator waveforms such as those shown in FIGS. 3B, 4B, 5B, 6B and 7B, but can be easily changed to accommodate any default pattern. Patterns can be loaded into the shift registers described above as well, allowing numerous patterns to be programmed.

Figure 3A:
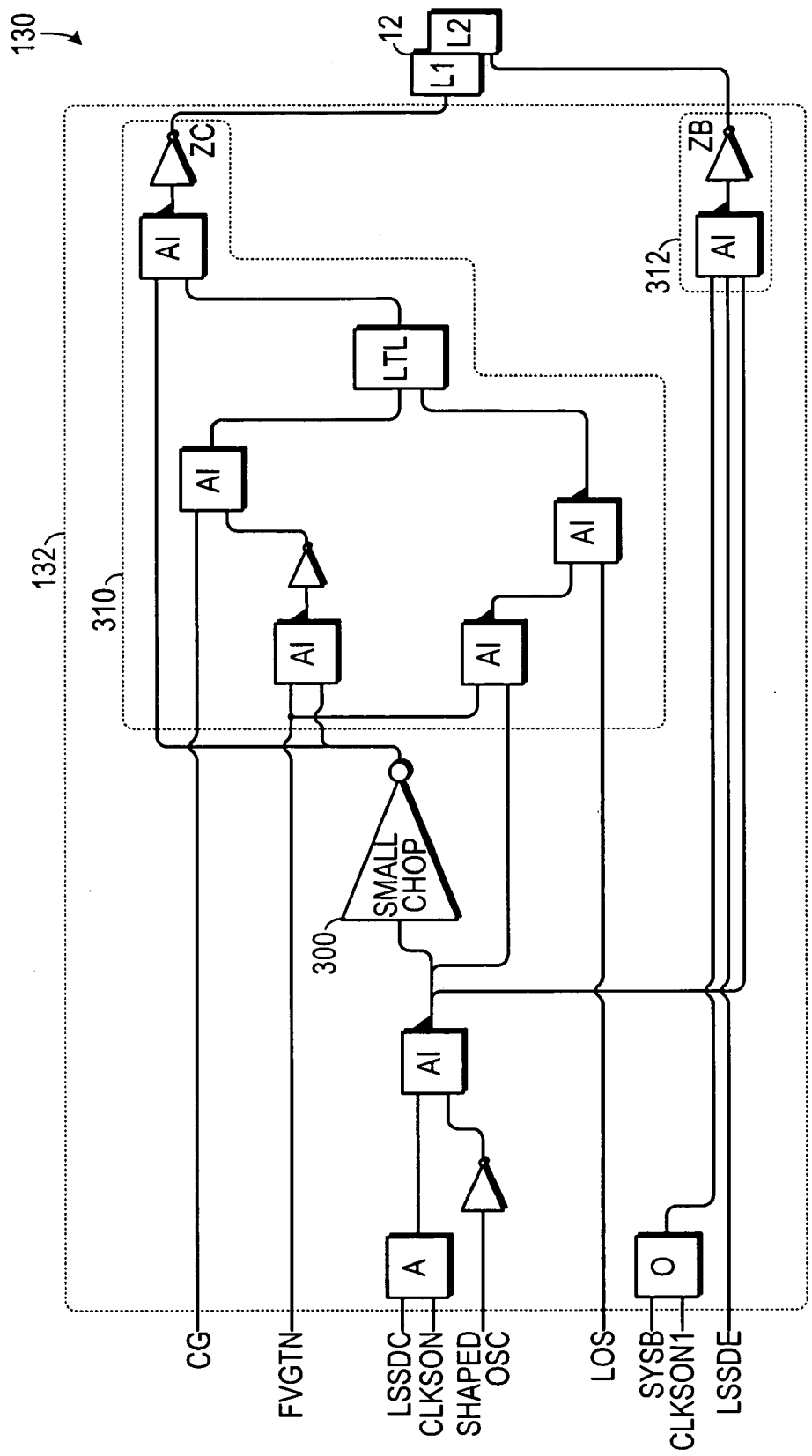
FIG. 3A is a schematic diagram of a generalized leaf clock splitter.

One idealized embodiment of a splitter leaf 130 is shown in FIG. 3A. This embodiment receives several test inputs (such as those labeled "CG," "FVGTN," "LSSDC," "CLKSON," "LOS," "SYSB," "CLKSON1," and "LSSDE"). The shaped oscillator clock signal (labeled "SHAPED OSC") is also applied to the splitter leaf 130. The splitter leaf 132 may include a delay driver or inverter 300 that delays the shaped oscillator clock signal by a partial cycle. The splitter leaf 132 may also include a first logic element 310 that is configured to combine the delayed oscillator clock signal logically with at least a second signal so as to generate a first latch clock signal ("ZC"). The splitter leaf 132 may also include a second logic element 312 that is configured to combine the shaped oscillator clock signal logically with at least one third signal so as to generate a second latch clock signal ("ZB").

Figure 3B:
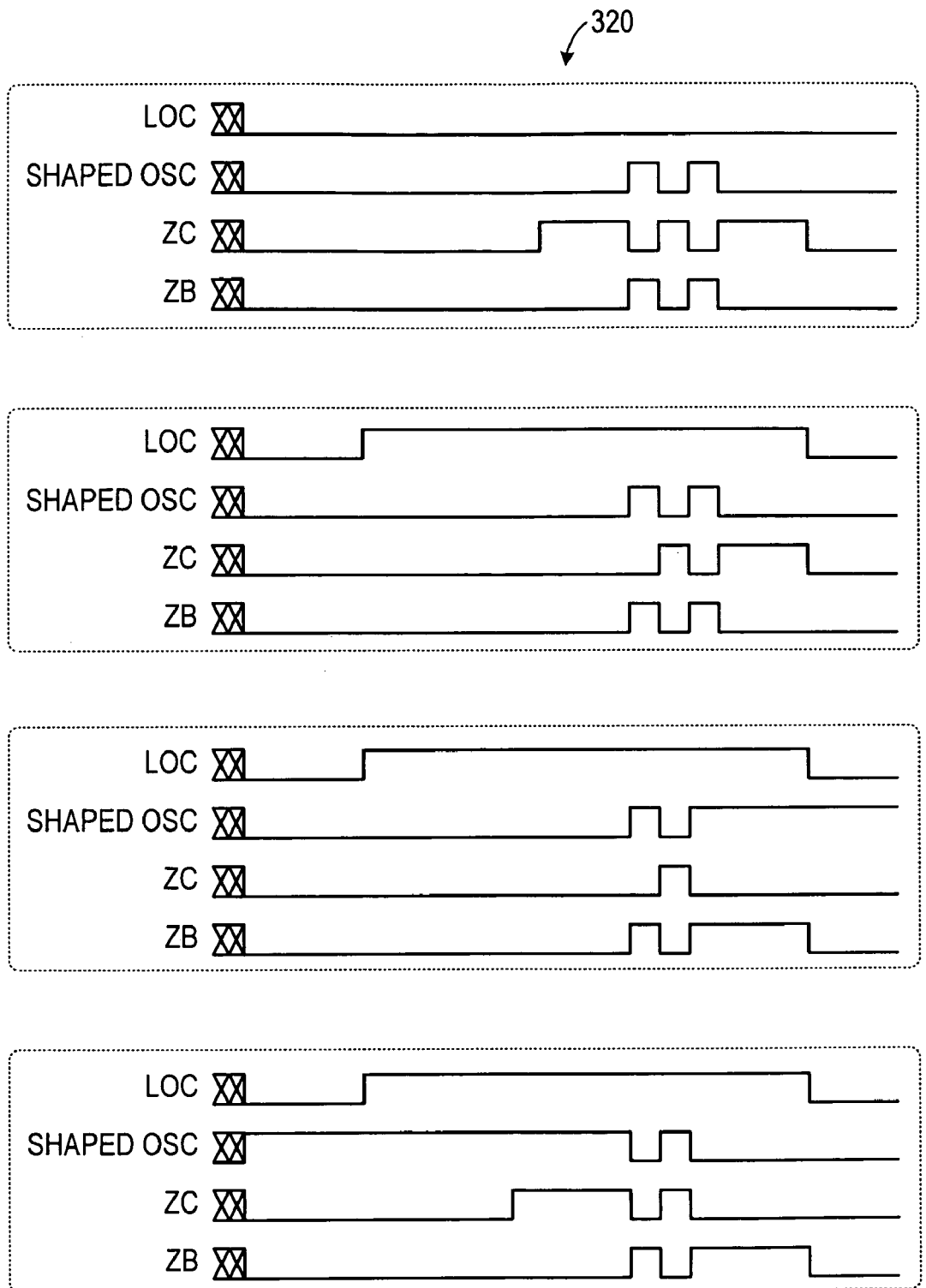
FIG. 3B is a waveform diagram corresponding to the circuit shown in FIG. 3A.

FIG. 3B shows several different waveforms 320 resulting from various combinations of test signals (shown collectively in this example for the sake of simplicity as "LOC") and the shaped oscillator clock signal ("SHAPED OSC"). In each case, the test signals are asserted and, once stabilized, the shaped oscillator clock signal is applied. As can be seen, this results in several different waveforms for the ZC and ZB latch clock signals.

Figure 4A:
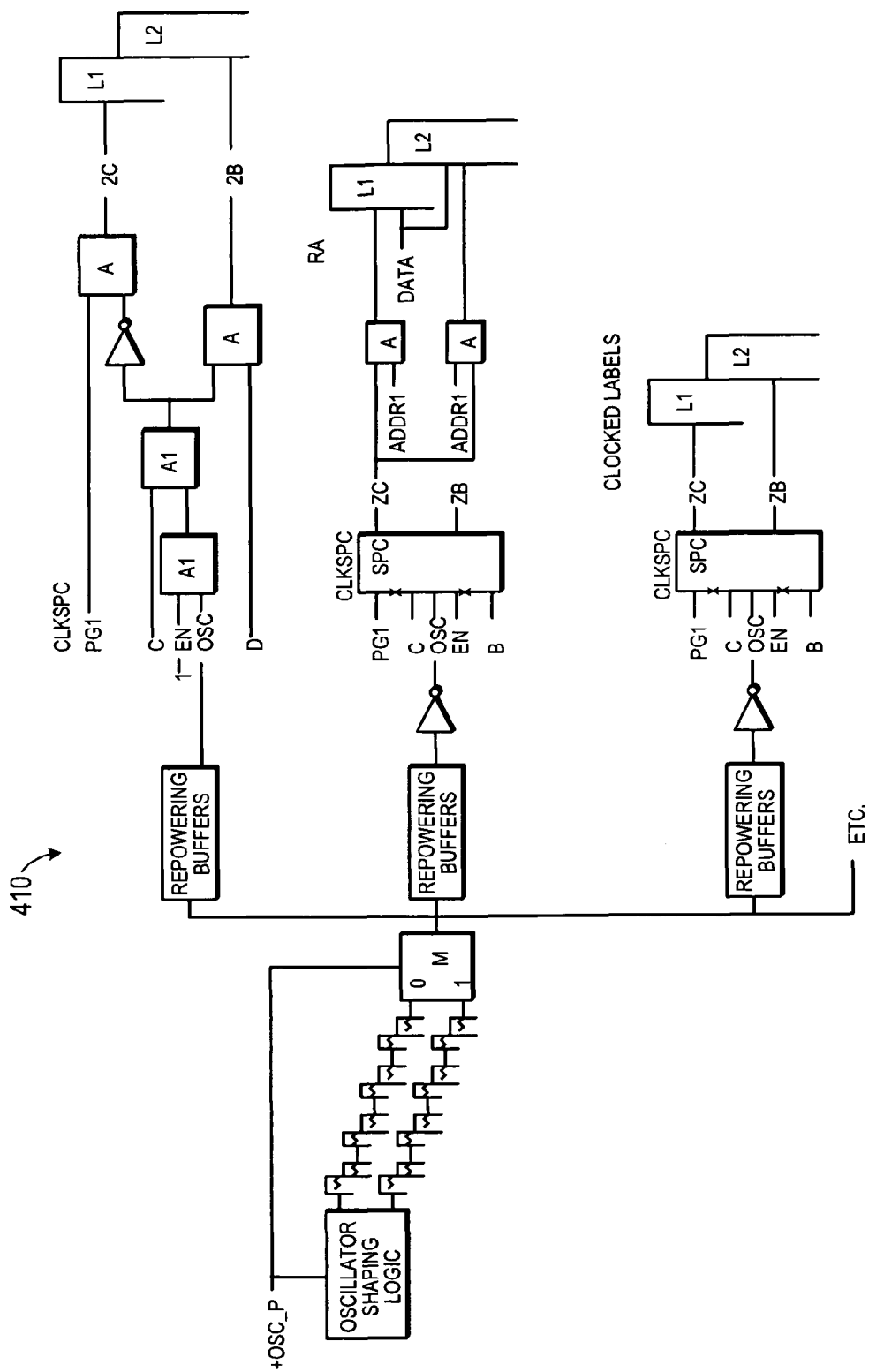
FIG. 4A is a schematic diagram of a first embodiment of a leaf clock splitter.
Figure 4B:
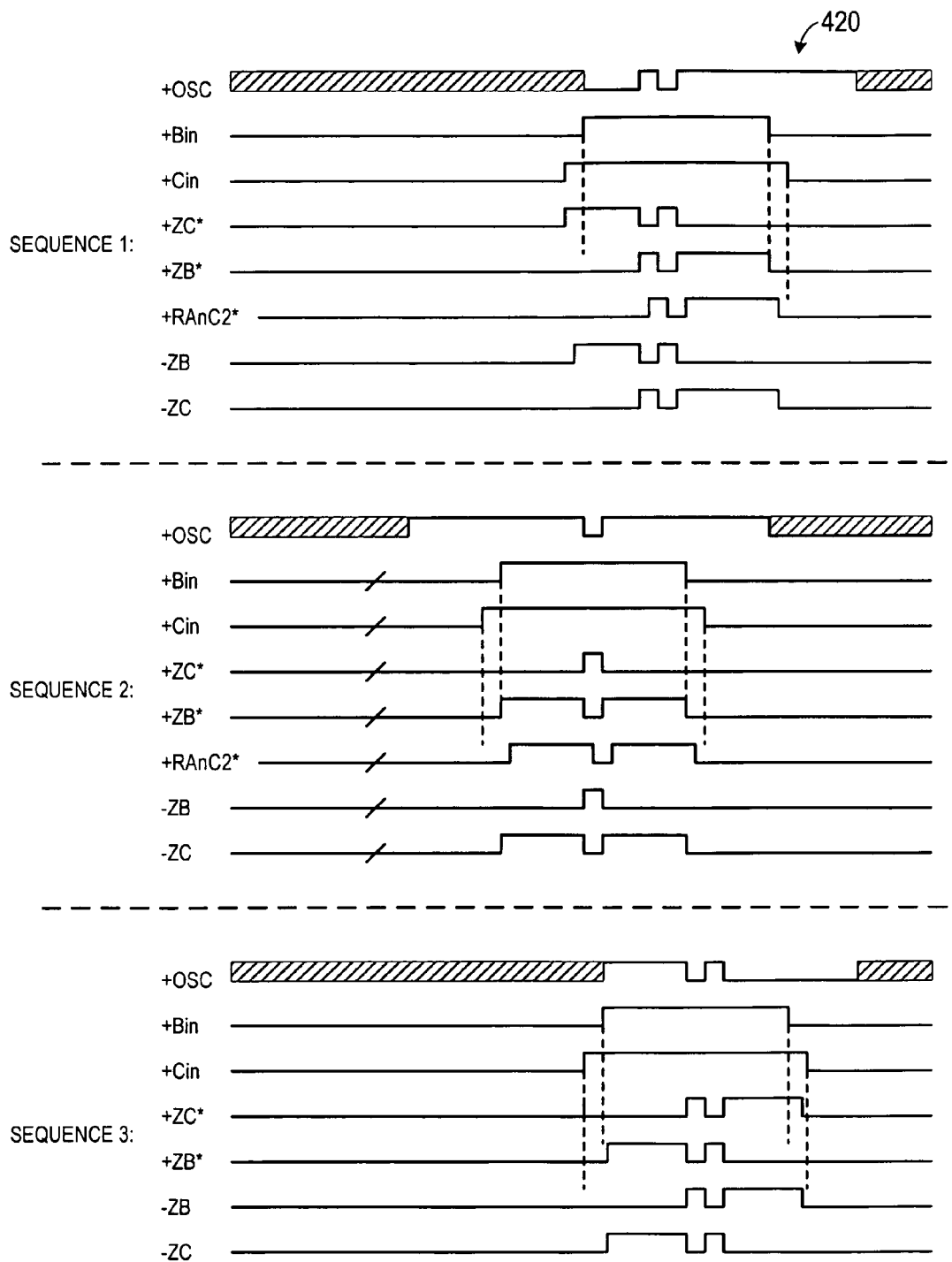
FIG. 4B is a waveform diagram corresponding to the circuit shown in FIG. 4A.

A more specific example of a splitter leaf 410 is shown in FIG. 4A (it should be noted in the examples that follow, the shaped oscillator clock signal is simply labeled "OSC"). Various waveform sequences 420 resulting from this example are shown in FIG. 4B. In this embodiment, all of the oscillator gating is at the root of the tree, and the splitter gating is consolidated to a common root before fanning out to a standard CU08 ASIC splitter (CLKSPC). To accomplish at-speed LBIST, the B and C gates of the CLKSPC are controlled to provide a large envelope around the gated oscillator. This gating takes place multiple cycles before and after the actual oscillator pulses occur, thus removing any timing dependence on the gating itself.

In Sequence 1 of FIG. 4B, the oscillator is pulsed in a 0-1-0-1 pattern, and held high until the B and C gates are turned back off. Also shown are the resultant splitter clocks (ZC and ZB) that drive latches and register arrays (RA). Two comparisons are summarized: LOS (Launch off Scan) versus LOC (Launch off Capture) and ac versus dc. LOS is preferred as the test data is more robust—resulting directly from the scan initialization. LOC test data started with the scan, but was moved through combinatorial logic before used to launch the test, thus limiting the test patterns. While both ac and dc have some speed aspect, ac here refers to a preferred at-speed test. In this sequence, when L2 states (slaves) are saved for BIST patterns (the L2 of the latch is scanned out), regularly clocked latches, as well as RA reads and writes, are ac tested, but with final captured latch data a result of an LOC pattern. Additionally, any paths that talk between these regular latches and negative-clocked (odd clocked) latches are also ac LOC. Paths that are strictly composed of odd-clocked latches see dc LOS results.

When L1 states are saved, required for complete RA coverage, but other logic has slightly worse results. All tests are now completely LOC, and any even-to-odd clock latch path is now dc (due to the C gate creating a long ZC pulse on the odd clock). In Sequence 2 the oscillator starts in a high state and pulses low for one cycle. Because this sequence only uses one clock pulse instead of two, as above, we get better dc test coverage on the LOS paths that are available, but ac coverage only on the even/odd crossing paths. When L2 states are saved, the normal clocked latch paths are all dc LOS. Only paths from odd-to-even clocked latches would see a full ac LOC test. When L1 states are saved, again the only ac test available is the LOC test from odd-to-even clocked latches, and we lose a few LOS tests. So the L1 saved test is again a secondary test primarily to pick up RA coverage. Sequence 3 in FIG. 4B results in purely LOC results, and when saving L2 states results in all ac testing on the odd-clock paths.

Figure 5A:
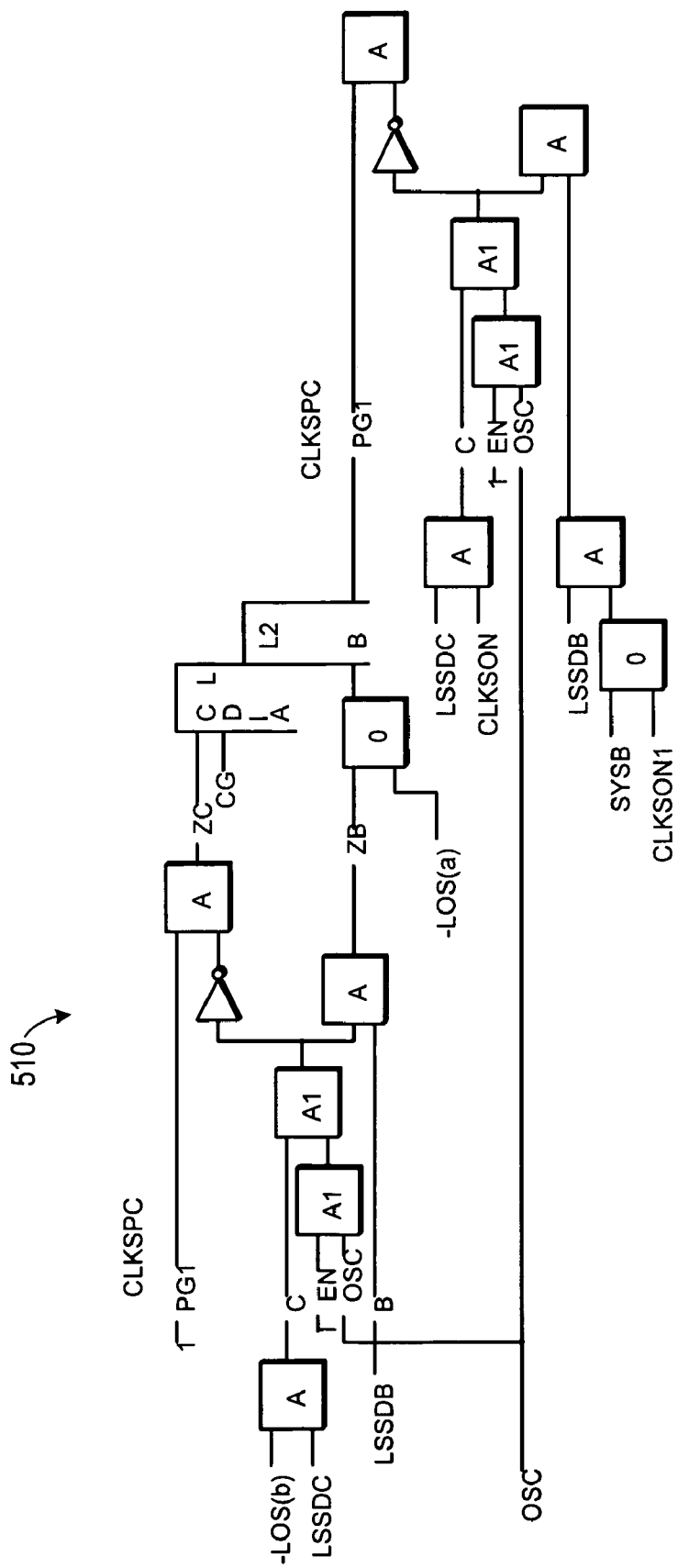
FIG. 5A is a schematic diagram of a second embodiment of a leaf clock splitter.
Figure 5B:
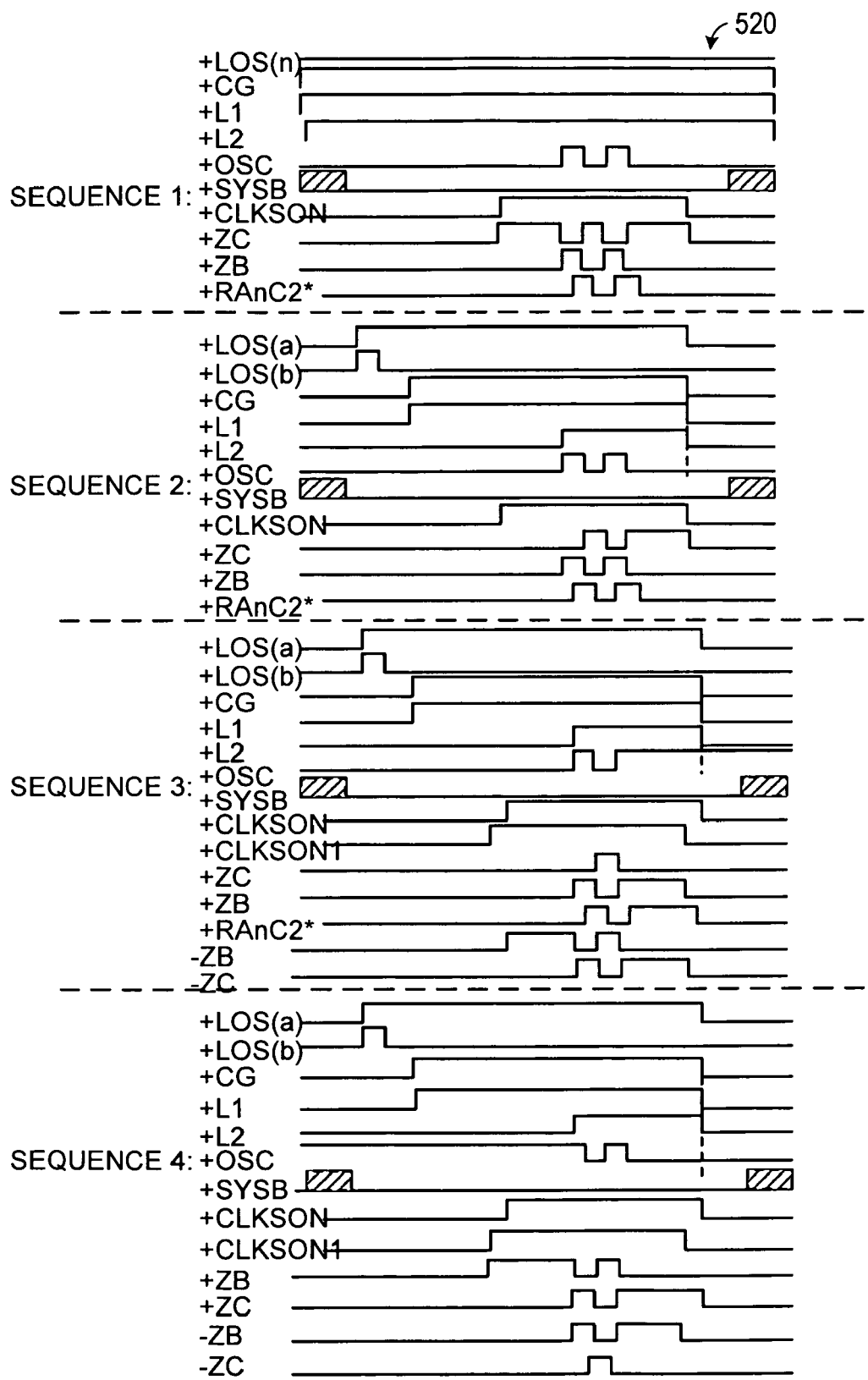
FIG. 5B is a waveform diagram corresponding to the circuit shown in FIG. 5A.

Another example of a splitter leaf 510 is shown in FIG. 5A and several waveform sequences 520 corresponding to this example are show in FIG. 5B. In FIG. 5A, an alternate design approach is taken in using two cascaded splitters. The benefit of this approach is that test coverage is improved while still using standard ASIC splitters along with some additional combinational logic. In Sequence 1, the oscillator is again a double pulse, which results in entirely LOC test coverage. Due to the gating surrounding the double splitter, we achieve full ac results when saving both L1 and L2 states. However this form of double clocking creates a new frequency maximum (FMAX) concern. Two quick pulses have been seen to cause a power droop, that results in the second paths running at slower speeds that the first paths. Unless designs are timed taking this into account, otherwise functional parts may fail this test, resulting in false yield loss. The cascading splitters also have some additional timing implications that need to be addressed.

Sequence 2 is similar to Sequence 1 except that some gates have been altered (primarily the LOS(n) pins) to provide more LOS coverage on the Register Arrays. In this sequence, all tests are still at speed (ac), but now all of the RA paths are LOS for the first address and LOC for the second. Again, this sequence may have FMAX issues.

Sequence 3 is similar to Sequence 2, except that one transition edge is removed from the oscillator to remove the FMAX issue. This also provides more LOS coverage for some of the logic paths. However, some of the at-speed coverage is lost, resulting in dc tests. Note that the odd clocks shown here and in Sequence 4 are created similarly to those in FIG. 4B, with an inverted oscillator input and minor changes to the splitter gating logic. Sequence 4 uses yet a third oscillator shape to attempt to recover some of the test coverage lost in Sequence 3, but continue to be FMAX clean. Being FMAX issue free sequences 3 and 4 are more viable for most products.

Figure 6A:
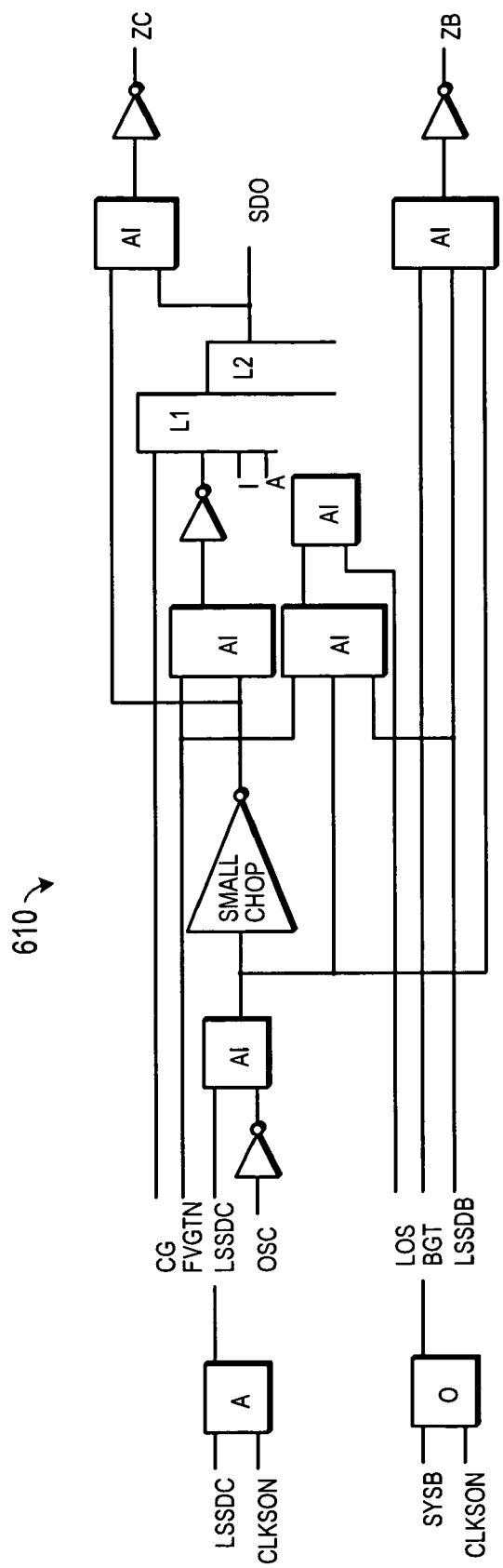
FIG. 6A is a schematic diagram of a third embodiment of a leaf clock splitter.
Figure 6B:
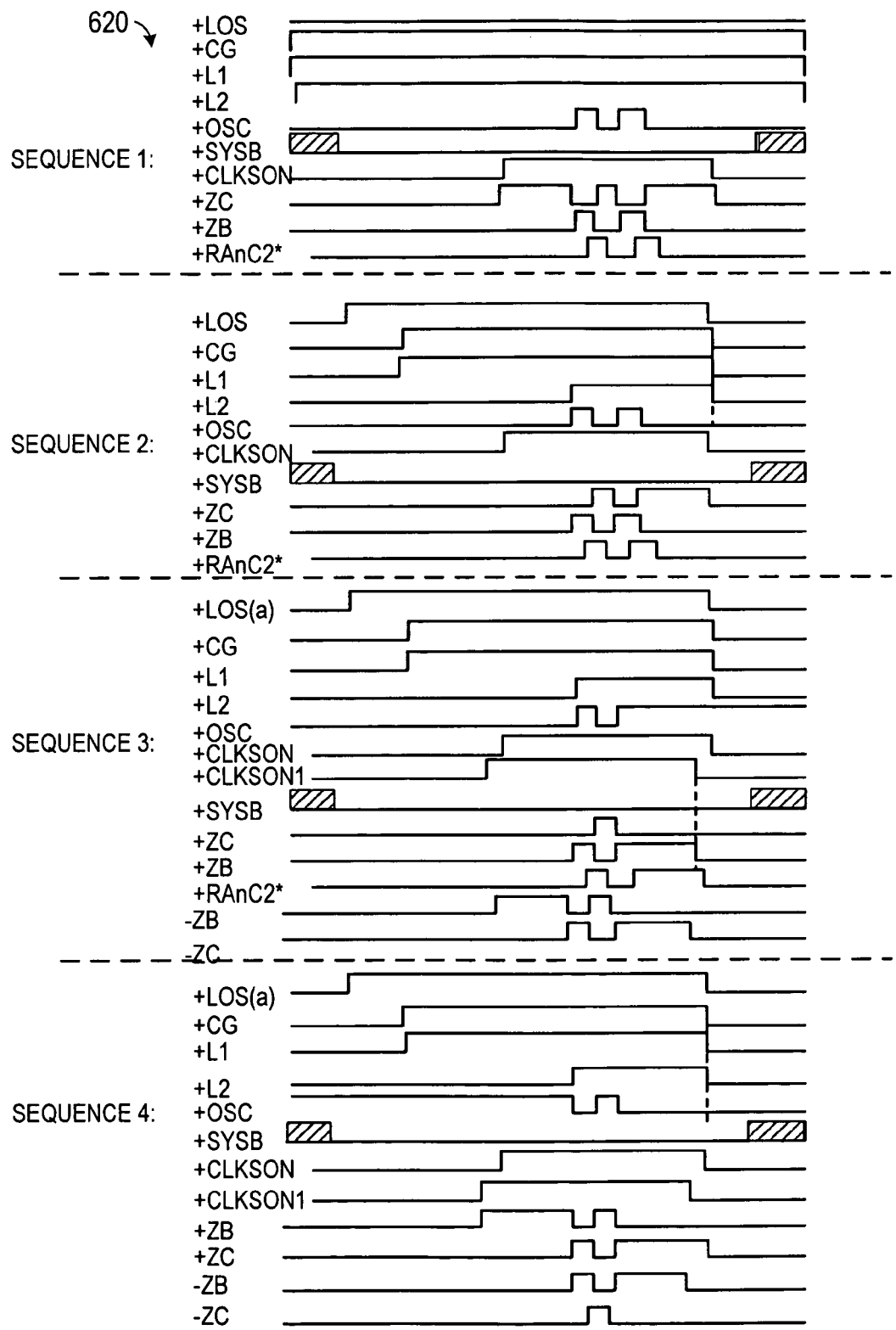
FIG. 6B is a waveform diagram corresponding to the circuit shown in FIG. 6A.

Another example of a splitter leaf 610 is shown in FIG. 6A and several waveform sequences 620 corresponding to this example are show in FIG. 6B. A new design for a splitter based on both the standard ASIC offering and a custom splitter, with one full latch stage removed is shown in FIG. 6A. This design essentially makes a core from the logic in FIG. 5A, consolidating the critical timing paths from that design into one set of input tests with a corresponding timing rule. As shown in FIG. 6B, in Sequence 1 all tests are still LOC, but only some of them run at-speed (ac). Sequence 2 uses different gating to force LOS coverage on some of the tests, resulting in slightly higher overall coverage. Again, both Sequences 1 and 2 suffer from FMAX issues.

Sequence 3 uses a different oscillator and achieves ac LOS coverage on the RA paths. Additionally, some of the logic paths are at-speed (ac) and some are LOS. Sequence 4 improves coverage on the logic paths by getting mostly ac tests with a few LOS paths. This design would amount to a much smaller physical imprint for the design compared to that shown in FIG. 5A and, though it has the same FMAX issues, is can provide better test coverage that those sequences shown in FIG. 4B.

Figure 7A:
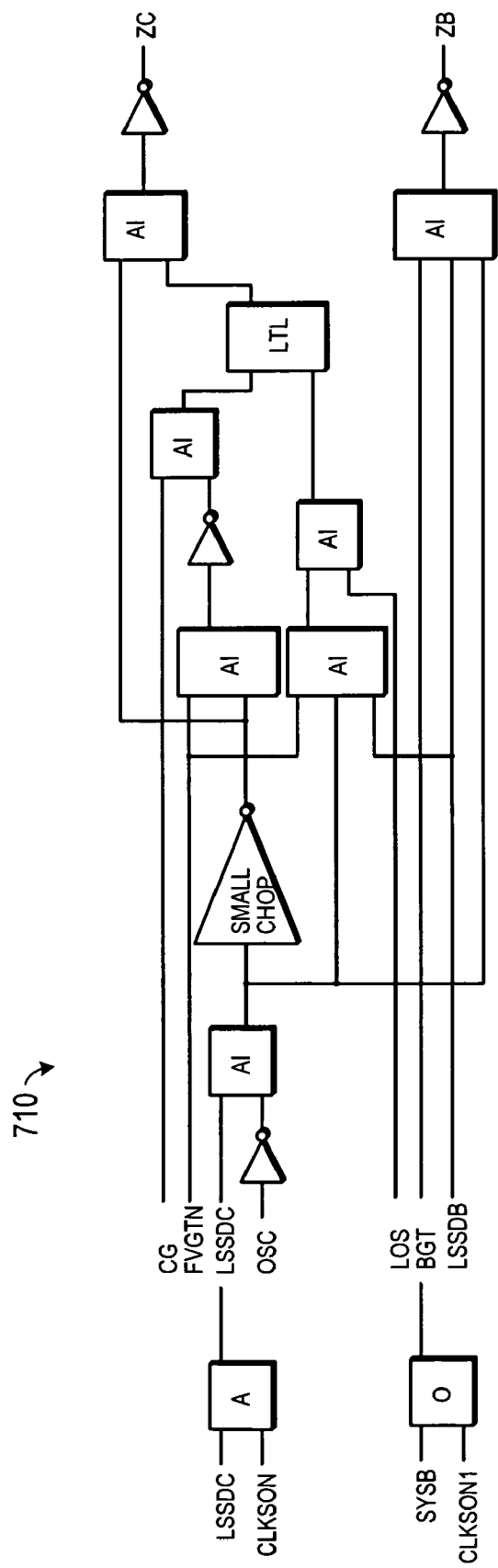
FIG. 7A is a schematic diagram of a fourth embodiment of a leaf clock splitter.
Figure 7B:
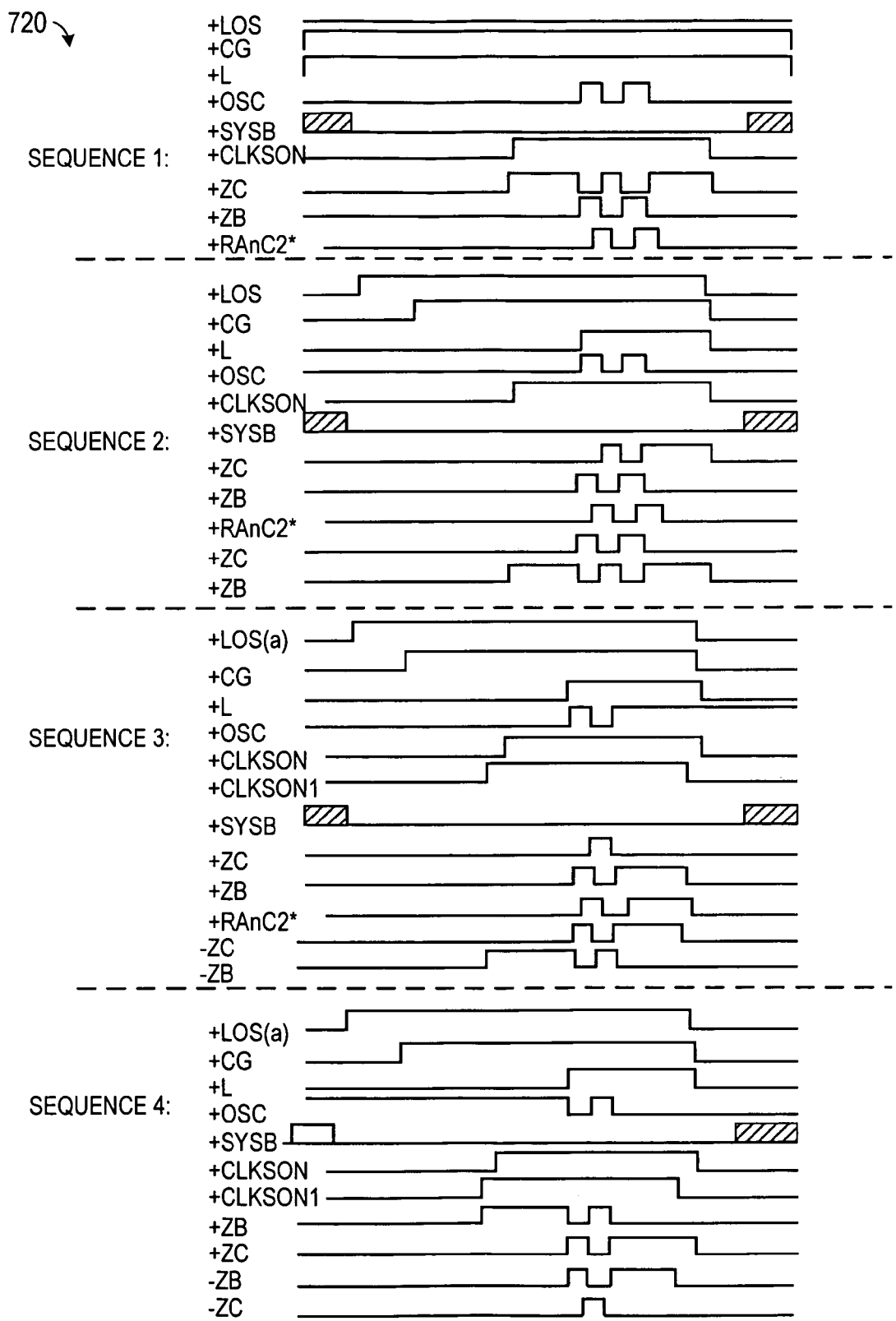
FIG. 7B is a waveform diagram corresponding to the circuit shown in FIG. 7A.

Yet another example of a splitter leaf 710 is shown in FIG. 7A and several waveform sequences 720 corresponding to this example are show in FIG. 7B. The splitter shown in FIG. 7A includes a single non-scan latch (LTL) in the ZC path instead of a full latch pair (L1L2). Although this splitter is now non-scannable, it has a smaller physical footprint that the splitter in FIG. 6A due to the removed latch stage, making integration easier.

As shown in FIG. 7B, Sequence 1 includes two back-to-back ac pulses that, when coupled with saving L2 states, results in full at-speed LOC coverage. Sequence 2 is similar, but results in full ac LOS coverage (except for the odd-clocked latches), followed by a bump in dc coverage.

Sequence 3 uses only a single ac oscillator pulse, resulting in full ac LOS coverage on all but the odd-clocked logic, but does not suffer from FMAX issues. This sequence has very good dc coverage, resulting in high overall test coverage. Similarly, Sequence 4 achieves full at-speed coverage on the odd logic when saving L2 states, and only odd-to-even paths are LOC, with everything else LOS coverage. Combined, this solution provides the best LBIST coverage with the lowest impact in physical design over the other designs proposed.

Use of this approach allows testing that approximates launch on scan testing of the LSSD latches and allows testing that approximates launch on scan testing of the LSSD latches. Thus, the systems disclosed herein allow the testing engineer greater flexibility in the circuit testing process.

The above described embodiments, while including the preferred embodiment and the best mode of the invention known to the inventor at the time of filing, are given as illustrative examples only. It will be readily appreciated that many deviations may be made from the specific embodiments disclosed in this specification without departing from the spirit and scope of the invention. Accordingly, the scope of the invention is to be determined by the claims below rather than being limited to the specifically described embodiments above.

What is claimed is:

1. A method of generating clock signals for a level-sensitive scan design latch, comprising the actions of:
   a. transmitting at least one test input signal to a plurality of splitter leaves;
   b. once the at least one test input signal is stabilized at each of the splitter leaves, generating a shaped oscillator clock signal having a predetermined pattern of pulses from a central root; and
   c. at the plurality of splitter leaves, logically combining the at least one test input signal with the shaped oscillator clock signal, thereby generating a first latch clock signal and a second latch clock signal, the logically combining action including:
      i. applying a delay of less than one clock cycle to the shaped oscillator clock signal to generate a delayed oscillator clock signal;
      ii. logically combining the delayed oscillator clock signal with at least a second signal so as to generate the first latch clock signal; and
      iii. logically combining the shaped oscillator clock signal with at least one third signal so as to generate the second latch clock signal.

2. The method of claim 1, wherein the action of shaping the oscillator clock signal comprises the actions of:
   a. loading a first predetermined pattern of bits into a first shift register;
   b. loading a second predetermined pattern of bits into a second shift register;
   c. coupling a next bit from the first shift register onto the shaped oscillator clock signal when the oscillator clock signal has a high value and then shifting the first shift register by one bit; and
   d. coupling a next bit from the second shift register onto the shaped oscillator clock signal when the oscillator clock signal has a low value and then shifting the second shift register by one bit.

3. The method of claim 2, further comprising the action of selectively coupling the oscillator clock signal on to the shaped oscillator signal line.

4. The method of claim 2, further comprising the action of selectively causing a predefined test signal to be coupled on to the shaped oscillator signal line.

5. The method of claim 2, further comprising the action of selectively coupling a stream of logical zeros on to the shaped oscillator signal line.

6. The method of claim 1, wherein the action of generating a first latch clock signal and a second latch clock signal comprises shaping the first latch clock signal and the second latch clock signal to approximate launch on scan testing of the latch.

7. The method of claim 1, wherein the action of generating a first latch clock signal and a second latch clock signal comprises shaping the first latch clock signal and the second latch clock signal to approximate launch on capture testing of the latch.

8. A method of generating clock signals for a level-sensitive scan design latch, comprising the actions of:
   a. transmitting at least one test input signal to a plurality of splitter leaves;
   b. once the at least one test input signal is stabilized at each of the splitter leaves, generating a shaped oscillator clock signal having a predetermined pattern of pulses from a central root; and
   at the plurality of splitter leaves, logically combining the at least one test input signal with the shaped oscillator clock signal, thereby generating a first latch clock signal and a second latch clock signal.

9. A method of generating a shaped clock signal, comprising the actions of:
   a. loading a first predetermined pattern of bits into a first shift register;
   b. loading a second predetermined pattern of bits into a second shift register;
   c. coupling a next bit from the first shift register onto the shaped clock signal when an oscillator clock signal has a high value and then shifting the first shift register by one bit; and
   d. coupling a next bit from the second shift register onto the shaped clock signal when the oscillator clock signal has a low value and then shifting the second shift register by one bit.

10. The method of claim 9, further comprising the action of selectively coupling the oscillator clock signal on to the shaped oscillator signal line.

11. The method of claim 9, further comprising the action of selectively causing a predefined test signal to be coupled on to the shaped oscillator signal line.

12. A circuit, responsive to an oscillator clock signal, for applying a first latch clock signal and a second latch clock signal to a latch employed in a level-sensitive scan design-type integrated circuit, comprising:
   a. an oscillator that is configured to assert a clock signal;

b. an oscillator shaping logic circuit that is configured to generate a predetermined sequence of test clock pulses and transmit the sequence of test clock pulses onto a shaped oscillator signal line; and c. a plurality of clock splitter waveform generators, distributed through the integrated circuit, each clock splitter waveform generator responsive to the shaped oscillator signal line and configured to generate the first latch clock signal and the second latch clock signal, each clock splitter waveform generator also configured to logically combine the shaped oscillator signal line with at least one test signal so as to generate the first latch clock signal to have a first predetermined waveform and so as to generate the second latch clock signal to have a second predetermined waveform.

13. The circuit of claim 12, wherein the oscillator shaping logic circuit comprises:

a. a first shift register configured to load a first predetermined pattern of bits therein;

b. a second shift register configured to load a second predetermined pattern of bits therein;

c. a first coupling circuit configured to couple a next bit from the first shift register onto the shaped oscillator clock signal line when the oscillator clock signal has a high value and then shifting the first shift register by one bit; and d. a second coupling circuit configured to couple a next bit from the second shift register onto the shaped oscillator clock signal when the oscillator clock signal has a low value and then shifting the second shift register by one bit.

14. The circuit of claim 13, further comprising an override circuit that causes the oscillator clock signal to be coupled on to the shaped oscillator signal line when the override circuit is in an override state.

15. The circuit of claim 13, further comprising a test mode circuit that causes a predefined test signal to be coupled on to the shaped oscillator signal line when the test mode circuit is in a test mode state.

16. The circuit of claim 12, wherein each of the plurality of clock splitter waveform generators comprises:

a. a circuit element that is configured to apply a delay of less than one clock cycle to the shaped oscillator clock signal to generate a delayed oscillator clock signal;

b. at least one first logic element that is configured to combine the delayed oscillator clock signal logically with at least a second signal so as to generate the first latch clock signal; and c. at least one second logic element that is configured to combine the shaped oscillator clock signal logically with at least one third signal so as to generate the second latch clock signal.

17. The circuit of claim 12, wherein the first predetermined waveform is configured to approximate launch on scan testing of the latch.

18. The circuit of claim 12, wherein the second predetermined waveform is configured to approximate launch on scan testing of the latch.

* * * * *